(12) United States Patent
Nguyen et al.

(10) Patent No.: US 9,791,511 B2
(45) Date of Patent: Oct. 17, 2017

(54) METHOD AND APPARATUS FOR LOW LATENCY COMMUNICATION IN AN AUTOMATIC TESTING SYSTEM

(71) Applicants: Thien D. Nguyen, Thousand Oaks, CA (US); George W. Conner, Camarillo, CA (US)

(72) Inventors: Thien D. Nguyen, Thousand Oaks, CA (US); George W. Conner, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 1222 days.

(21) Appl. No.: 13/836,567

(22) Filed: Mar. 15, 2013

(65) Prior Publication Data

US 2014/0278177 A1    Sep. 18, 2014

(51) Int. Cl.
*G01N 37/00*    (2006.01)
*G01R 31/319*    (2006.01)
*G01R 31/3193*    (2006.01)

(52) U.S. Cl.
CPC . *G01R 31/31907* (2013.01); *G01R 31/31935* (2013.01)

(58) Field of Classification Search
CPC ........ G01R 31/31935; G01R 31/31907; G01R 31/31921; G01R 31/3004; G01R 31/2834; G01R 31/3167
USPC ...................................................... 702/81, 84
See application file for complete search history.

(56) References Cited

U.S. PATENT DOCUMENTS

| | | |
|---|---|---|
| 5,659,783 A | 8/1997 | Banno |
| 2004/0187049 A1 | 9/2004 | West |
| 2005/0015388 A1 | 1/2005 | Dasgupta et al. |
| 2005/0207436 A1 | 9/2005 | Varma |
| 2005/0246603 A1 | 11/2005 | Rottacker et al. |

OTHER PUBLICATIONS

International Search Report and Written Opinion for PCT/US2014/021695 mailed Jun. 17, 2014.

*Primary Examiner* — An Do
(74) *Attorney, Agent, or Firm* — Wolf, Greenfield & Sacks, P.C.

(57) ABSTRACT

According to some aspects, a system and method for processing messages in a plurality of successive cycles is provided. One such system may include a plurality of first circuits, each first circuit configured to output a message, the plurality of first circuits configured to operate synchronously, a first plurality of buffers, each buffer associated with a respective first circuit and configured to store a message output by the respective first circuit, a communication path configured to receive the plurality of messages from the buffers and to perform aggregation of the messages, thereby generating an aggregated indication, and one or more second circuits. The one or more second circuits are configured to operate synchronously and to receive the aggregated indication, wherein buffers of the first plurality of buffers are configured to store messages from respective first circuits for different times.

30 Claims, 8 Drawing Sheets

METHOD AND APPARATUS FOR LOW LATENCY COMMUNICATION IN AN AUTOMATIC TESTING SYSTEM

BACKGROUND

An important stage in the fabrication of semiconductor devices is ensuring that a device is behaving as designed. This stage, known as "test," is often performed using automatic test equipment, or "testers," which analyze the behavior of the device automatically. Such automatic test equipment comprise complex electronics capable of sending test signals to, and measuring values of test signals from, one or more test points on one or more devices under test (DUTs).

To fully test a device, a tester must generate and measure signals such as those that may be found in the operating environment of the DUT. For some tests, the operations performed in the tester to generate or measure a test signal are defined by a test pattern. In operation, circuitry inside the tester, called a "pattern generator," may execute the pattern. The test pattern may specify, for each of numerous tester cycles, what signals to send to, or that are expected to be measured at, each of numerous test points on the DUT. The signals measured by the tester provide an indication of test results, that is, whether the DUT is behaving as designed.

For a tester to properly evaluate test results on a semiconductor device, it is often necessary for the tester to determine both that a specific signal was detected and that the signal occurred at a specific time. Testers may include "pin electronics" circuitry that determines whether signals measured at the DUT have expected values at expected times. To signal to other components the results of these comparisons, the pin electronics may set flags. The flags are propagated through the tester and portions of the tester may take actions based on the flags. For example, subsequent generated and/or measured signals may be based on one or more flags.

However, a tester may comprise multiple components, each of which may play a role generating or measuring signals, or both. For example, it may be convenient for a tester to comprise a number of modules to aid upgrades and/or repairs, or to allow adaptation of the tester to the test of a particular semiconductor device. In order for generated and measured signals to be based on the flag, the flag needs to be applied throughout the tester to reach multiple components with a specific time relationship.

For example, when a flag is set in a cycle of tester operation to indicate that the DUT is not behaving as designed, the test system may adapt subsequent testing operations based on this test failure. In order for the test system to perform tests efficiently, the tester may also need to coordinate subsequent actions amongst its components promptly after the test signal is generated. For example, upon detecting that a DUT being tested has failed a test, the components of the tester involved in that test may cease operations to test that DUT, already known to have failed, and reset for testing another DUT. Though, these actions must be coordinated so that the components all generate and measure signals for testing the next DUT at a coordinated time.

One way to coordinate components is to provide centralized circuitry that is connected through point to point wiring to all of the components to provide a reference clock and exchange flags with all components. For example, each pattern generator could operate synchronously based on the reference clock signal provided by the centralized circuitry. When a flag is set in one component, the signal may be communicated from the component to the centralized circuitry, which then communicates commands to all of the pattern generators. However, there may be practical constraints on the number of physical connections that can be made between components in the testing system.

SUMMARY

Some embodiments provide a system for processing messages in a plurality of successive cycles, comprising a plurality of first circuits, each first circuit configured to output a message, the plurality of first circuits configured to operate synchronously, a first plurality of buffers, each buffer associated with a respective first circuit and configured to store a message output by the respective first circuit, a communication path configured to receive the plurality of messages from the buffers and to perform aggregation of the messages, thereby generating an aggregated indication, and one or more second circuits, the one or more second circuits configured to operate synchronously and to receive the aggregated indication, wherein buffers of the first plurality of buffers are configured to store messages from respective first circuits for different times.

Some embodiments include a method of processing event information in a plurality of successive cycles, the method comprising during a first cycle, generating a message at each of a plurality of first circuits, buffering each message for a variable length of time in one of a first plurality of buffers, each of the first plurality of buffers associated with one of the plurality of first circuits, during a second cycle, setting a value at a first position of the communication path coupled to a first buffer of the first plurality of buffers, wherein the first plurality of buffers are coupled to the communication path in a first order, in each of a plurality of cycles following the second cycle, communicating the value along the communication path to a subsequent position along the communication path, the subsequent position associated with a subsequent buffer in the first order and updating the value by aggregating the value with a message from the buffer at the subsequent position, thereby generating an aggregated indication, and during a third cycle, providing the aggregated indication to each of one or more second circuits.

Some embodiments provide an interface circuit for an automatic test system in which a communication path carries messages, comprising a plurality of input ports, a plurality of output ports, a reference clock input, a first plurality of buffers coupled to the reference clock input, each buffer of the first plurality of buffers coupled to an input port and configured to receive messages at a time controlled by the reference clock, a communication path configured to receive the plurality of messages from the first plurality of buffers and to perform aggregation of the messages, thereby generating an aggregated indication, and a second plurality of buffers, each buffer of the second plurality of buffers coupled to an output port, configured to store an aggregated indication and to synchronously output the aggregated indication to a respective output port.

The foregoing is a non-limiting summary of the invention, which is defined only by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
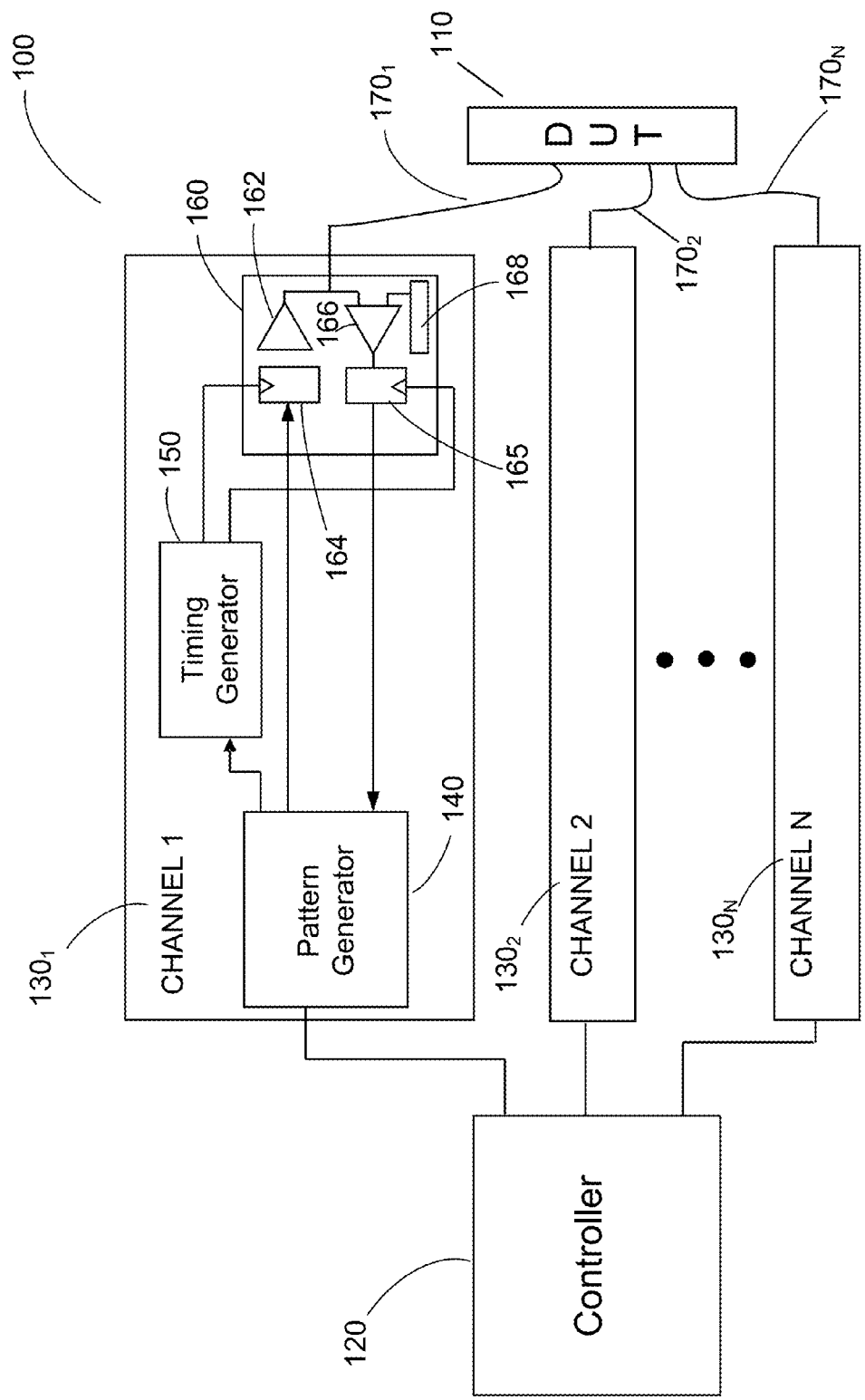
FIG. 1 illustrates a system suitable for testing a device using automatic test equipment that may be used in connection with any of the embodiments of the invention.

The inventors have recognized and appreciated that enabling reliable distribution of flags while eliminating discrete point to point wiring routed to a central circuit to distribute flags to multiple components enables a range of desirable functionality. For example, different portions of the test system may operate as different "logical pattern generators." Each logical pattern generator may control a different subset of the components of the test system to perform in synchrony, without requiring the components associated with other logical pattern generators to also be synchronized with those components. As a result, the components associated with each logical pattern generator may start, stop or alter the execution flow of a pattern at different times in response to different events. Such flexibility may be useful, for example in testing, with a single test system, multiple DUTs concurrently or testing a DUT with multiple functional cores that operate autonomously.

The inventors have further recognized and appreciated that distributing flags without discrete point to point wiring to a central circuit may enable more logical pattern generators in a tester than can be practically implemented with discrete wiring. Further, the inventors have recognized and appreciated that discrete wiring may restrict the flexibility of a test system, because the wiring must be in place for a particular module to be installed in the test system.

Embodiments of a test system as described herein may provide greater flexibility in configuring and using a test system by a serial communication path between modules. The values of a flag generated by all of the modules in the same tester cycle may be aggregated on the communication path. For example, if the flag signals a failure in a cycle, the communication path may aggregate information from the modules indicating whether a failure was detected by that module during the cycle such that an aggregated indication of whether any failure occurred during the cycle may be read from the communication path at the same time.

In some embodiments, this aggregation may occur by logically combining flags into a single value. For example, the aggregated indication may be set to indicate a failure if any of the flags from the individual modules indicates a failure. In other embodiments, the aggregated indication may be created by organizing information on the communication path such that flags from different modules, representing events during the same tester cycle, may be available at the same time to modules receiving information over the communication path.

To provide appropriate timing relationships of the flags and the aggregated indication, the inputs and/or outputs of the modules may be coupled to the communication path through buffers. The buffers may be configured to buffer information for a time that relates to the propagation time of temporally related information along the communication path. For example, the communication path may connect modules serially, defining an order. Each cycle, a packet of information may pass from an interface circuit associated with one module to an interface circuit associated with a next module in the order. The modules generating flags may be connected first in the order. The modules responding to the flags may be connected last in the order.

As a packet of information representing events during a specific cycle passes from the interface circuit for one module to the next, that interface circuit will provide information relating to the specific cycle for aggregation with information already in the packet relating to that cycle. Accordingly, once a packet has traversed a first part of the path associated with modules generating information about events during a cycle, the packet will contain aggregated flags for all of the modules.

As this packet continues along the communication path, the aggregated information for a particular cycle becomes available to the modules connected last in the order. A successive interface circuit may, for example, have access to the packet in each successive cycle. Accordingly, after N cycles, X modules may add information to the packet and Y packets may access that information, where (X+Y)=N.

To provide proper timing of distribution of flags, buffers that store information for different lengths of time may be used to couple the inputs and/or outputs of modules to the communication path. When a particular timing relationship exists between a module and the communication path, a buffer may be used to store a flag output by the module for a length of time such that the timing relationship will be respected by the time that the buffer outputs the flag to the communication path. For example, if a module generates a flag during a particular cycle, and the communication path is configured such that it will read the flag M cycles later, the flag may be put into a buffer such that it will be read M cycles later.

It may be beneficial for modules to provide flags synchronously, for example to coordinate information about the testing system at a particular time from multiple modules in the testing system. The aggregation of such flags may therefore provide an indication of the state of the testing system at a particular time. For example, a number of modules may provide flags indicating the result of a test (e.g., pass or fail) in each cycle. By aggregating these flags an indication of whether these modules collectively passed or failed the test may be provided to other parts of the testing system.

Flags and/or aggregated indications may be accessed by the testing system in a synchronous fashion. For example, flags and/or aggregated indications may be accessed such that a time relationship between the flags and/or aggregated indications is preserved. Such a time relationship may include generation of the flags and/or aggregation indications at the same time, or during a single cycle of the test system, but may also include generation at different times and processing such that a time relationship of the generation is preserved during processing.

Components of the testing system may perform actions based on the reading of one or more flags and/or aggregated indications, which may allow components of the testing system to act in concert to perform testing functions. For example, if an aggregated indication provides an indication of the success or failure of a test, the testing system may coordinate subsequent actions based on the indication by synchronously reading the aggregated indication at each module throughout the testing system.

Following below are more detailed descriptions of various concepts related to, and embodiments of, methods and apparatus for implementing low latency communication in an automatic testing system. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 illustrates a system suitable for testing a device using automatic test equipment that may be used in connection with any of the embodiments of the invention. In particular, FIG. 1 illustrates tester 100 that comprises controller 120 which controls channels $130_1$, $130_2$, ... $130_N$ to, for each cycle, generate signals for, or measure signals from, a device under test (DUT) 110. Channels $130_1$, $130_2$, ... $130_N$ send and receive test signals to or from DUT 110 via lines $170_1$, $170_2$, ... $170_N$, respectively. It will be appreciated that N may take any suitable value depending on the needs of the testing system.

Controller 120 may include, for example, a computer programmed to direct the testing process carried out by tester 100. Such an exemplary controller may further collect and/or process data during tests and may provide an interface to an operator. Controller 120 may also include circuitry shared by multiple of the channels $130_1$, $130_2$, ... $130_N$.

In the example of FIG. 1, channel $130_1$ is shown in additional detail, and includes pattern generator 140, timing generator 150 and pin electronics 160. Pattern generator 140 performs execution of a test pattern that defines the operation of the test channel $130_1$ during each cycle of the test system. For example, an operation may execute a portion of the test pattern that causes the test system to interact with DUT 110. Such interaction may include driving one or more test signals to one or more test points on DUT 110, and/or receiving one or more test signals from one or more test points on DUT 110. An automatic test system, such as system 100, programmed with a test pattern may store the test pattern in any suitable location such that the pattern generator is able to retrieve and execute the test pattern. As a non-limiting example, the test pattern may be stored in a memory located within system 100, e.g., within pattern generator 140.

Timing generator 150 creates timing signals that control the transitions between test signals. For example, timing generator 150 may define the start time when a test signal begins to be provided to DUT 110, or the time at which a test signal provided from DUT 110 should be measured.

Pin electronics 160 provide an interface for test signals sent to and received from DUT 110 via line $170_1$. In particular, pin electronics 160 include drive circuitry that provide the test signals to one or more test points on DUT 110, and include detection circuitry that receives test signals from one or more test points on DUT 110. The drive circuitry includes driver 162 and flip-flop 164. Flip-flop 164 is clocked by the timing signal provided by timing generator 150 and is supplied with data from pattern generator 140. Thereby, flip-flop 164 is able to control the particular test signal output by driver 162 and the time at which it is output.

Pin electronics 160 may also detect test signals from DUT 110 via line $170_1$ and comparator 166. The comparator receives test signal(s) provided from one or more test points on DUT 110 in addition to a reference value provided by programmable reference value generator 168. Comparator 166 may determine whether received test signal(s) match a specified value, or a range of specified values, provided from the programmable reference value generator 168. For example, comparator 166 may be used to determine whether test signals received from DUT 110 match the expected results of the test being performed, and may provide a high or low value based on whether a test signal is above or below an expected value. A flag indicating the success or failure of a test may thereby be generated and provided to pattern generator 140. Latch 165 is clocked by timing generator 150, and effects the output of comparator 166 sent to pattern generator 140 for further processing.

The example of FIG. 1 is provided as a non-limiting example of providing test signals to, and receiving test signals from, a device under test using a pattern generator. However, any suitable implementation of an automatic test system may be used as the invention is not limited in this respect. It will be appreciated that FIG. 1 is provided as a conceptual example of performing test, and that actual circuitry in a test system may include components not shown in FIG. 1, and/or may connect the components shown using a different configuration. For example, in actual circuitry the pattern generator may not provide the clock or data to flip-flop 164 or latch 165; rather, the pattern generator may provide control signals to timing generator 150 and may receive control signals from the timing generator and/or other components in the system.

As described above, the result of a test may be embodied in a message, such as a flag, and may be distributed throughout the test system in order that components of the test system may take action based on the message. For example, pattern generator 140 shown in FIG. 1 may receive an indication that DUT 110 failed a test. To allow any pattern generators located in any of channels 2, ... N shown in FIG. 1 to adapt their testing based on this failure, the indication of the failure can be communicated to one or more of these pattern generators. However, in order for the pattern generators to base subsequent operations on the indication, each pattern generator may need to take action with a particular timing relationship, such as at the same time. As described above, a system having flexibility in configuring and using a test system may be effected by providing a serial communication path between modules.

Figure 2:
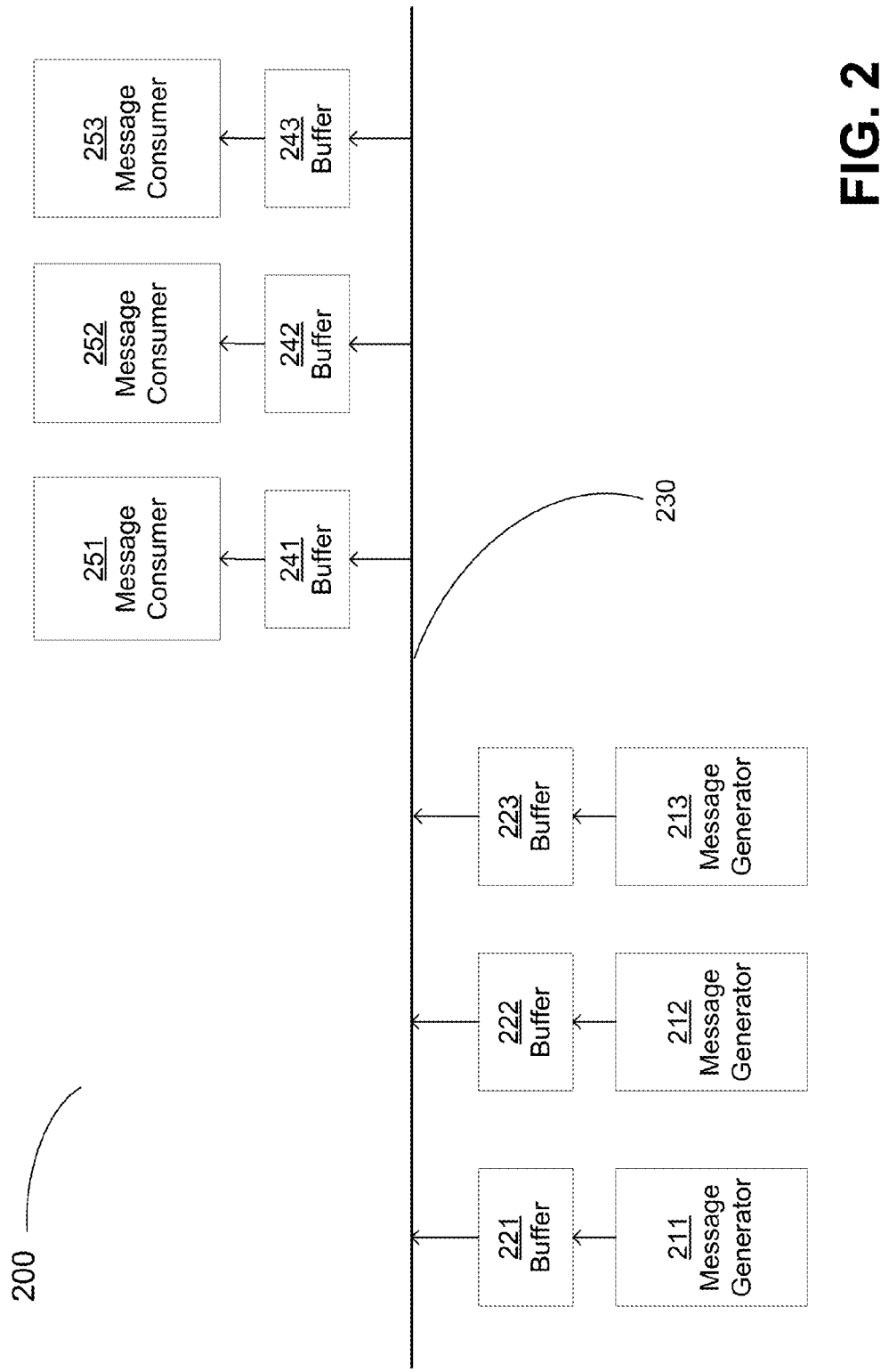
FIG. 2 depicts a schematic view of a system suitable for processing messages using a serial communication path, according to some embodiments.

FIG. 2 depicts a schematic view of a system suitable for processing messages using a serial communication path, according to some embodiments. In the example of FIG. 2, system 200 comprises serial communication path 230 that communicates messages originating from message generators 211-213 to message consumers 241-243.

Message generators 211-213 may comprise any circuitry able to provide a message as output. For example, message generators 211-213 may be pattern generators that are part of an automatic testing system, or may be modules (that may comprise any number of pattern generators) in an automatic testing system. Though, any suitable message generator may be used as the invention is not limited in this respect.

Message generators 211-213 operate to synchronously provide a message to respective buffers 221-223. For example, system 200 may operate in successive cycles of a clock, and message generators 211-213 may each output a message that indicates an event, wherein the events all happened during the same cycle of a test system. However, any technique to ensure that message generators 211-213 output message synchronously may be used.

In any embodiment in which the message generators comprise one or more pattern generators, the messages provided may reflect any suitable indication from any component of the one or more pattern generators. For example, the message may indicate the success or failure of a single test performed by a single pattern generator, or may indicate the success or failure of a collection of tests performed by a collection of pattern generators. For example, the message generators may be pattern generators and the message provided may be an indication of a test failure, e.g., in the form of a flag, such as a single bit, representing a successful or failing test. As another example, the message generators may be logical groups of pattern generators, which may each comprise circuitry to combine the output of the pattern generators in each logical group and provide a single output indicating the collective success or failure of the tests performed by the pattern generators.

Irrespective of the content of the message, buffers 221-223 receive a message from respective message generators (e.g., buffer 221 receives a message from message generator 211). Each buffer stores a message received from the message generator. A buffer may store the message for any suitable length of time, which may be for a number of cycles of the operation of system 200, though may also store the message an amount of time shorter than a cycle (i.e., the buffer passes the message on during the same cycle in which it receives it).

Buffers 221-223 may comprise any suitable hardware capable of storing a message, such as a queue, a stack or a ring buffer. In some embodiments, the buffers are First-In, First-Out (FIFO) buffers. However, in general any suitable mechanism for buffering messages may be used. The buffers 221-223 may be of a type where the contents of one location in the buffer is provided as an output during each cycle of the buffer's operation. For example, the buffers may be FIFOs in which a message is buffered for some number of cycles before being output.

In some embodiments, the buffers store messages in the buffer at different times. For example, a buffer may store a message in a first location in the buffer and in a subsequent cycle of system 200 may store another message in the same location in the buffer. Where the buffer is a FIFO this may, for example, allow messages to be output from the buffers to the communication path at different times subsequent to the storing of the message in the buffer.

Irrespective of how the buffers 221-223 store the messages, when the buffers output the messages they are provided to communication path 230, which performs aggregation of the messages. The communication path may aggregate the message in any suitable way, including by performing logical operations on the messages or by combining some or all of the messages into another message. In some embodiments, aggregation is performed at multiple locations in the communication path. For example, the aggregation of a message output from buffer 221 may be performed in the communication path and then this aggregated message may be subsequently aggregated with a message output from buffer 222. This aggregation may be performed in time, such that multiple messages relating to events can be read at the same time. Alternatively or additionally, aggregation may be done by combining messages into a single value providing an indication of whether an event occurred in any of the circuits that was aggregated. However, in general any aggregation operation may be performed at any number of locations in communication path 230.

Irrespective of how aggregation of messages is performed, the aggregated message is provided to buffers 241-243. As with buffers 221-223, buffers 241-243 may comprise any suitable hardware capable of storing a message, such as a queue, a stack or a ring buffer, including a FIFO buffer. The buffers 241-243 may be of a type where the contents of one location in the buffer is provided as an output during each cycle of the buffer's operation. For example, the buffers may be FIFOs in which a message is buffered for some number of cycles before being output. In some embodiments, one or more buffers store a message for less than a cycle of system 200 (i.e., the buffer passes the message on during the same cycle in which it receives it).

Buffers 241-243 output an aggregated message to a respective message consumer 251-253. For example, buffer 241 outputs an aggregated message to message consumer 251. Message consumers 251-253 may be any circuitry able to perform one or more actions (or signal other circuitry to perform one or more actions) based on the received aggregated message. For example, a message consumer may be a component of a testing system that performs subsequent operations based on the received aggregated message.

It should be appreciated that the particular example of FIG. 2 is non-limiting and that system 200 could be configured to use any number of message generators, buffers and message consumers in a manner consistent with the above description. In addition, the communication path 230 need not be connected serially with buffers 221-223 or buffers 241-243, and may instead have multiple connections to any buffer along its path. Message generators and/or message consumers may also not have a one-to-one relationship with buffers as shown in the example of FIG. 2. For example, a single message generator may provide messages to multiple buffers, and/or a single buffer may receive messages from multiple message generators. In addition, the communication path may comprise multiple tracks such that multiple messages may be communicated through the communication path (and may also be aggregated) in parallel.

In some embodiments, the circuitry that generates messages is part of the same circuitry that consumes the messages. For example, a pattern generator in a test system could both generate messages in response to a test failure and consume an aggregated indication of test failures (e.g., to determine subsequent actions during test). In such embodiments, the communication path 230 would become a loop, receiving messages from message generators, performing aggregation of the messages, and then providing the aggregated message back to the same message generators. These embodiments are depicted in the example of FIG. 3.

Figure 3:
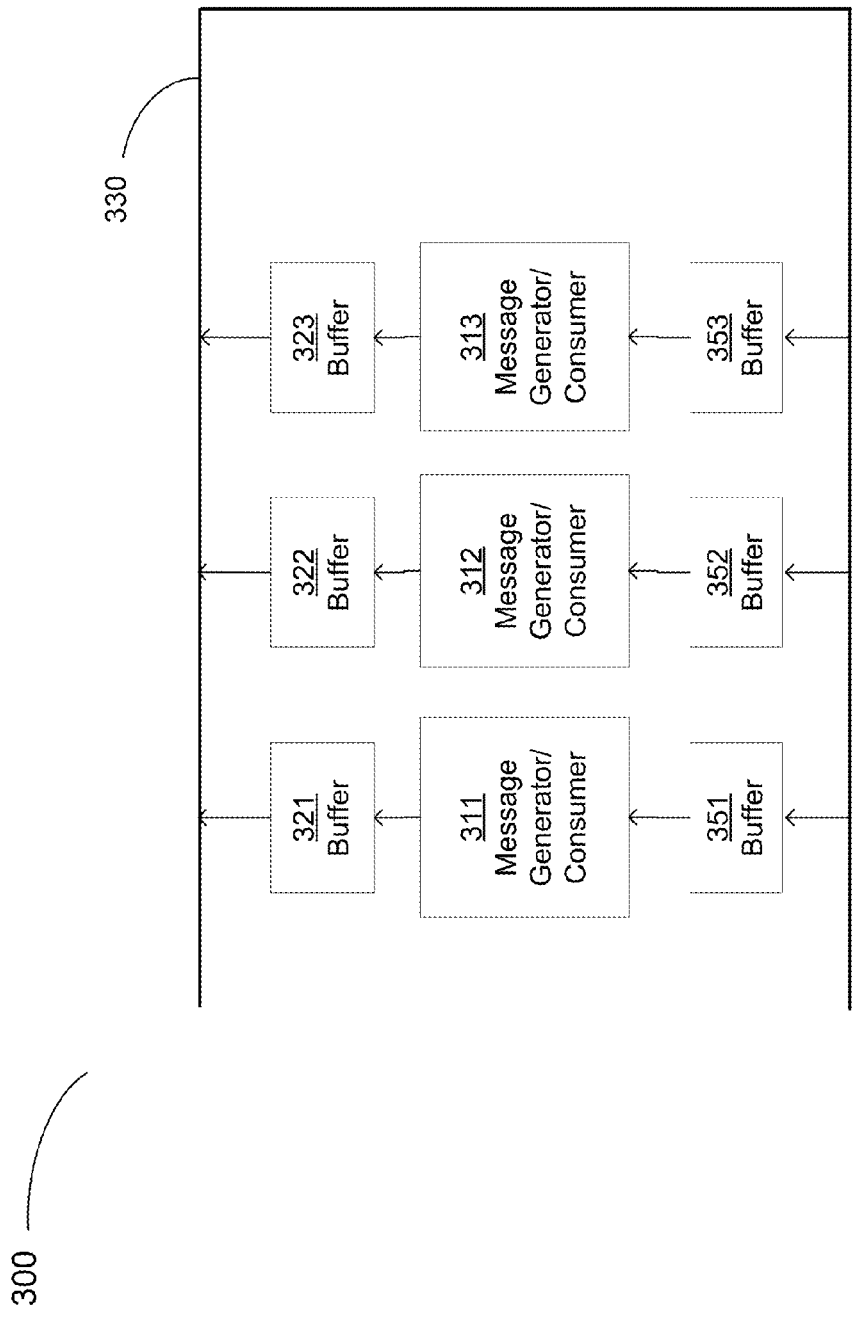
FIG. 3 depicts a schematic view of a system suitable for processing messages using a serial communication path, according to further embodiments.

FIG. 3 depicts a schematic view of a system suitable for processing messages using a serial communication path, according to some embodiments. In the example of FIG. 3, system 300 provides messages from message generator/consumers 311-313 to communication path 330, which performs aggregation of the messages and provides the aggregated messages back to message generator/consumers 311-313.

Figure 4:
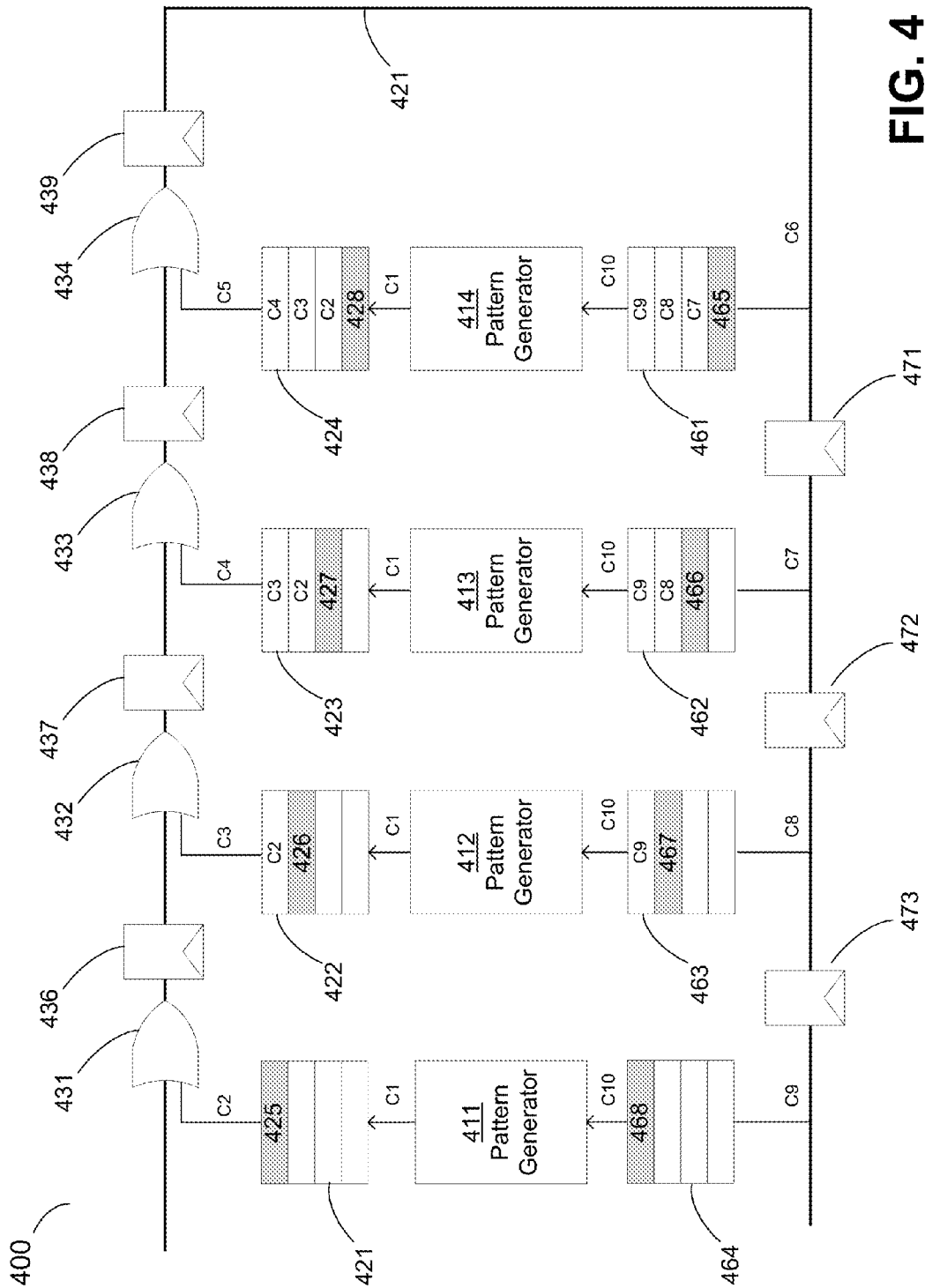
FIG. 4 depicts a schematic view of circuitry suitable for processing flags generated by a plurality of pattern generators in an automatic testing system, according to some embodiments.

FIG. 4 depicts a schematic view of circuitry suitable for processing flags generated by a plurality of pattern generators in an automatic testing system, according to some embodiments. In the example of FIG. 4, system 400 performs aggregation of flags generated by pattern generators 411-414 and provides an aggregated indication back to the pattern generators. System 400 performs this process over ten cycles of the system; at the end of each cycle data being propagated through the system is latched at one of flip-flops 436-439 or 471-473, or latched within one of buffers 421-424 or 461-464. System 400 comprises communication path 401 which performs aggregation via OR gates 431-434 and which latches data at the end of each cycle in flip-flops 436-439 or 471-473.

In the example of FIG. 4, buffers 421-424 store the received flags at the bottom of their queue; the effective depth of each queue may differ based on its position in the order of buffers and pattern generators as it is connected to communication path 401.

Buffers 421-424 are depicted in FIG. 4 as a queue with four slots; however, it should be appreciated that this depiction is used merely to clearly demonstrate the concepts being described, and that any implementation of the buffers consistent with the description herein may be used. As a particular example, buffers 421-424 may be FIFOs and the buffers depicted in FIG. 4 may be implemented with four different distances between the read and write pointers in the FIFO's memory (e.g., buffer 421's pointers are closer together than buffer 424's pointers). Though, any implementation of any type of buffer in which flags are stored for a particular length of time based on their position in system 400 may be used, as the invention is not limited in this regard.

Furthermore, the flags stored in buffers 421-424 in successive cycles are represented by "C2," "C3" and "C4" in FIG. 4, though it will also be appreciated that this is indicated to represent the concept of a flag stored in a buffer over a number of cycles of system 400, and actual circuitry may differ from what is shown in FIG. 4. As in the example of buffers 421-424 being FIFOs, indications "C2," "C3" and "C4" may indicate the effective distance between the read pointer and the flag stored in the buffer during successive cycles after the flag is first stored in the buffer.

During a first cycle of system 400 (denoted by "C1" in FIG. 4), pattern generators 411-414 each generate a flag that indicates whether a test performed by the respective pattern generator was successful or whether the test failed. For example, the flag may be a one-bit value (i.e., high or low) indicating success or failure of the test. During this cycle, pattern generators 411-414 provide flags to respective buffers 421-424.

During the first cycle of system 400, a flag output from pattern generator 411 is stored in slot 425 in buffer 421. Buffer 421 is configured such that, during the next cycle, the contents of slot 425 will be output from the buffer. Also during the first cycle of system 400, a flag output from pattern generator 412 is stored in slot 426 in buffer 422. Buffer 422 is configured, such that, during the next cycle the contents of slot 426 will propagate to the next slot in buffer 422, marked "C2" in FIG. 4. Similarly, during the first cycle of system 400 a flag output from pattern generator 413 is stored in slot 427 in buffer 423; and a flag output from pattern generator 414 is stored in slot 428 in buffer 424.

During the second cycle of system 400, the flag stored in slot 425 in buffer 421 is output from buffer 421. Also during this cycle, flags stored during the first cycle in slots 426, 427 and 428 in buffers 422, 423 and 424 respectively, are propagated to the next slot in respective buffers, each of which are marked "C2" in FIG. 4.

The flag output from buffer 421 is input to OR gate 431 which aggregates the flag with the contents of communication path 401 being input to the other input of the OR gate. For example, the communication path 401 might provide a low value to the input of OR gate 431 so that the output of the OR gate is indicative of the value provided from buffer 421. However, any suitable value may be provided for aggregation with the value provided by the buffer. At the end of the second cycle, the value output from the OR gate is latched in flip-flop 436.

During the third cycle of system 400, buffer 422 outputs the flag that was provided to slot 426 during the first cycle. Also during this cycle, flags stored during the first cycle in slots 427 and 428 in buffers 423 and 424 respectively, are propagated to the next slot in respective buffers, each of which are marked "C3" in FIG. 4. The flag output from buffer 422 is input to OR gate 432 which aggregates the value with the value latched in flip-flop 436, which is the value that was output from OR gate 431 during the previous cycle. At the end of the third cycle, the value output from OR gate 432 is latched in flip-flop 437.

During the fourth cycle of system 400, buffer 423 outputs the flag that was provided to slot 427 during the first cycle. Also during this cycle, the flag stored during the first cycle in slot 428 in buffer 424 is propagated to the next slot in that buffer, marker "C4" in FIG. 4. The flag output from buffer 423 is input to OR gate 433 which aggregates the value with the value latched in flip-flop 437, which is the value that was output from OR gate 432 during the previous cycle. At the end of the fourth cycle, the value output from OR gate 433 is latched in flip-flop 438.

During the fifth cycle of system 400, buffer 424 outputs the flag that was provided to slot 428 during the first cycle. The flag output from buffer 424 is input to OR gate 434 which aggregates the value with the value latched in flip-flop 438. At the end of the fifth cycle, the value output from OR gate 434 is latched in flip-flop 439.

During the above-described cycles of the operation of system 400, the four flags provided by pattern generators 411-414 during the first cycle, have thereby been aggregated to provide an aggregated indication, latched at the end of the fifth cycle in flip-flop 439.

In the example of FIG. 4, the aggregated indication is provided to the pattern generators 411-414 via buffers 461-464. This may allow the pattern generators to receive an indication of any test failures from any one of the pattern generators 461-464. For example, if pattern generator 411 generates no test failures but pattern generator 414 does generate a test failure, within a few cycles of system 400 pattern generator 411 may receive an indication of that failure via the aggregated indication.

During the sixth cycle of system 400, the aggregated indication latched in flip-flop 439 is provided to slot 465 of buffer 461 and is additionally latched in flip-flop 471. Buffer 461 is configured, such that, during the next cycle the contents of slot 471 will propagate to the next slot in buffer 461, marked "C7" in FIG. 4. Buffers 461-464 are similarly configured to propagate the contents of each slot to succeeding slots in the respective buffer, as described below.

During the seventh cycle of system 400, the aggregated indication latched in flip-flop 471 is provided to slot 466 of buffer 462 and is additionally latched in flip-flop 472. Also during this cycle, the flag stored during the sixth cycle in slot 465 in buffer 461 is propagated to the next slot in that buffer, marked "C7" in FIG. 4.

During the eighth cycle of system 400, the aggregated indication latched in flip-flop 472 is provided to slot 467 of buffer 463 and is additionally latched in flip-flop 473. Also during this cycle, the flag stored during the sixth cycle in slot 465 in buffer 461, and the flag stored during the seventh cycle in slot 466 in buffer 462, are each propagated to the next slots in those buffers, marked "C8" in FIG. 4.

During the ninth cycle of system 400, the aggregated indication latched in flip-flop 473 is provided to slot 468 of buffer 464 and is additionally latched in flip-flop 474. Also during this cycle, the flag stored during the sixth cycle in slot 465 in buffer 461, the flag stored during the seventh cycle in slot 466 in buffer 462, and the flag stored during the eight cycle in slot 467 in buffer 463, are each propagated to the next slots in those buffers, marked "C9" in FIG. 4.

During the tenth cycle of system 400, the aggregated indication is output from each of buffers 461-464 to the respective pattern generators 411-414. As described above, this may, for example, allow the pattern generators to receive an indication of a test failure from any of pattern generators 411-414 within a number of cycles of system 400.

It should be appreciated that the example of FIG. 4 is provided merely as an exemplary configuration of a communication path that aggregates messages from pattern generators, and that other embodiments of the invention may utilize other configurations not shown in FIG. 4. For example, any method of aggregation may be utilized, as the invention is not limited to performing an OR operation on one-bit flags; rather, any suitable operation, not limited to logical operations, may be performed. In addition, it will be appreciated that any number of pattern generators may be utilized.

Furthermore, it should be appreciated that although the example of FIG. 4 depicts aggregation over a number of cycles, other embodiments of the invention may utilize a different, though fixed, number of cycles of system 400 in each aggregation step. In such an embodiment, the positions within the buffers that the flags are stored in the first cycle will be adjusted accordingly to ensure that the flags are output by the buffers at the appropriate time to be aggregated. For example, it may be that the hardware associated with each aggregation step (e.g., from flip-flop 436 to flip-flop 437) takes four cycles of system 400, not a single cycle as shown in the example of FIG. 4. In this example, buffers 421-424 would need to have sufficient storage for up to 13 slots to ensure that, during the first cycle, flags can be placed in slots 1, 5, 9 and 13 in buffers 421-424 respectively.

Furthermore, it should be appreciated that system 400 may be processing data at some or all steps in the aggregation process during any cycle. While the example of FIG. 4 depicted a sequence of ten cycles beginning with exemplary flags being output by the pattern generators 411-414, it will be appreciated that the same sequence may begin again at any time after the beginning of the exemplary sequence of FIG. 4. For example, the pattern generators may output flags every cycle; the pattern generators may receive an aggregated indication every cycle; and the flip-flops 436-439 and 471-473 may latch data at the end of every cycle. System 400 may thereby provide a fixed and known time for the test failure from any one of a group of pattern generators to be propagated back to all of the same pattern generators.

As described above, a test system may comprise multiple pattern generators in multiple modules. Furthermore, the modules may be connected to a backplane comprising multiple slots, and/or there may be multiple backplanes in the test system. Additional aggregation may therefore be performed across slots and/or backplanes in addition to the aggregation performed across the pattern generators within a module, as described in relation to FIG. 4 above.

Figure 5:
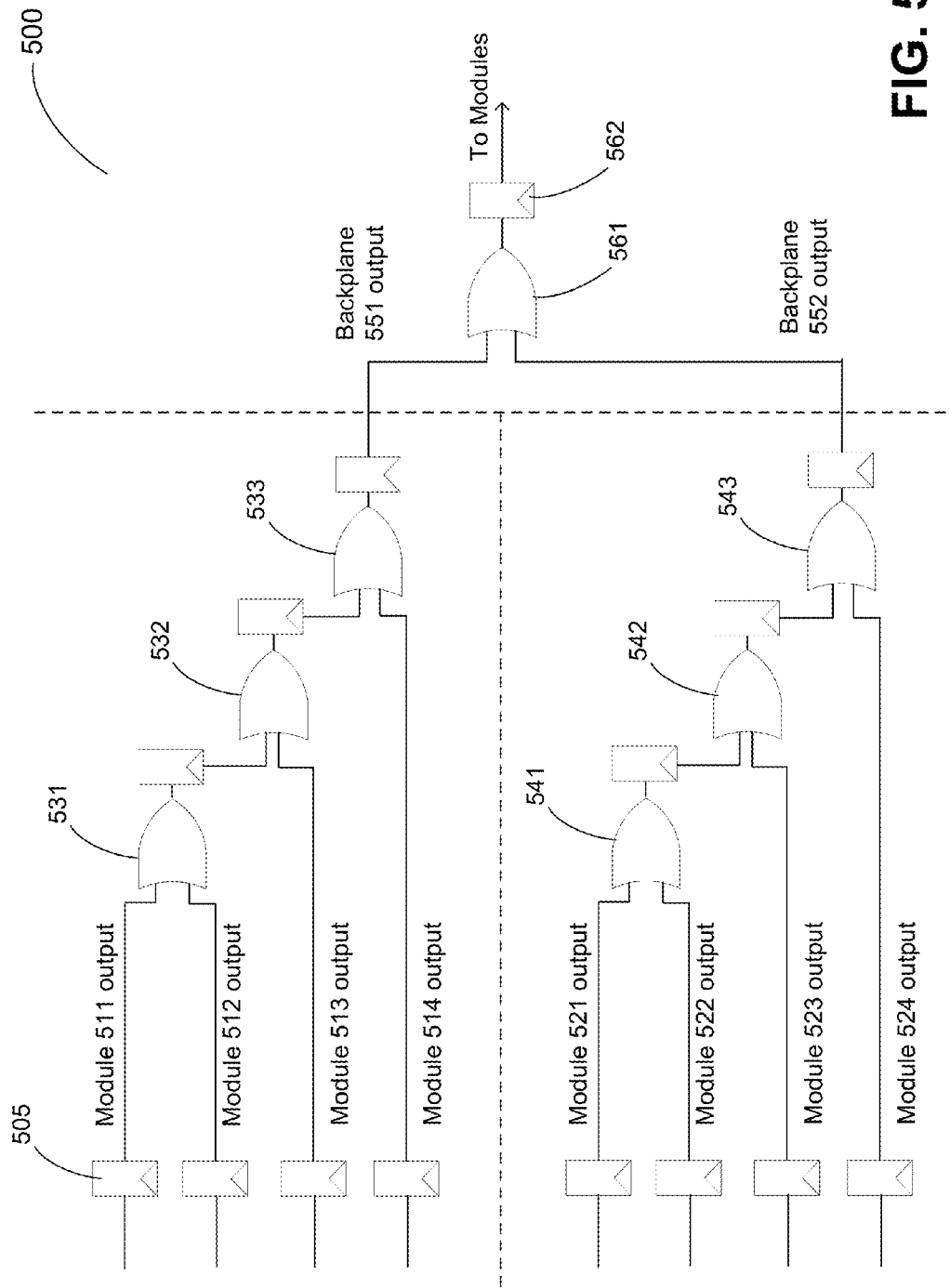
FIG. 5 depicts a schematic view of circuitry suitable for aggregating flags across modules and backplanes in an automatic testing system, according to some embodiments.

FIG. 5 depicts a schematic view of circuitry suitable for aggregating flags across modules and backplanes in an automatic testing system, according to some embodiments. In the example of FIG. 5, once an aggregated indication has been determined within each module, it is further aggregated across the four modules in each of two backplanes, and then further aggregated across the two backplanes. The aggregated indications determined within each module, for example at flip-flop 439 shown in FIG. 4 may be provided to system 500 for further aggregation. For example, the example of FIG. 5 may be combined with the example of FIG. 4 by providing the output of flip-flop 439 as an input to system 500 (e.g., by identifying flip-flop 505 in FIG. 5 as the flip-flop 439). Similarly, other modules may provide aggregated indications determined within those modules as the other inputs shown in FIG. 5. The output of system 500, being an aggregated indication provided from flip-flop 562, is then returned to each of the eight modules for distribution in the manner described in FIG. 4 for cycles 6-10.

In the example of FIG. 5, aggregated indications output from modules 511-514 are aggregated over three cycles by OR gates 531, 532 and 533. As described above in relation to FIG. 4, the aggregated indication of flags representing the success or failure of a test may be aggregated to generate an indication as to whether any tests failed within the pattern generators that generated the flags. The output of module 511 thereby represents the aggregated indication of the pattern generators in module 511, the output of module 512 represents the aggregated indication of the pattern generators in module 512, etc. The output of OR gate 533 thereby provides an aggregated indication for all of the pattern generators in modules 511-514. Similarly, the output of OR gate 543 provides an aggregated indication for all pattern generators in modules 521-524.

In the example of FIG. 5, modules 511-514 are in backplane 551 and modules 521-524 are in backplane 552. The aggregated indications output from each backplane are then aggregated in OR gate 561 which may produce a "global" aggregated indication of the whole test system. Since the aggregation within each backplane may occur concurrently with the aggregation in the other backplane, aggregation in system 500 may take 4 additional cycles over the processing performed in the example of FIG. 4. For example, in a test system with 2 backplanes, 4 modules in each backplane, and 4 pattern generators in each module (making 32 pattern generators in total), the aggregated indication of all pattern generators in the system may be synchronously provided to all 32 pattern generators within 14 cycles of the flags being generated.

The examples of FIGS. 4 and 5 may thereby provide a low-latency indication of a failure anywhere within an automatic test system to all pattern generators in that system. However, the examples of FIGS. 4 and 5 depict a system in which a single indication of a test failure (i.e., the aggregated indication) is generated for a portion of the test system; any information about which component generated the failure test flag is lost in this use case.

It may be beneficial in some use cases to utilize a different aggregation technique to retain information about which component generated the failure test flag. For example, by time multiplexing the flags, more information about the component that generated the failure may be provided in the aggregated indication. However, this technique may result in a lower time resolution because an indication generated using a particular component of the system is being generated every M cycles, where M is greater than 1, rather than during every cycle as in the examples of FIGS. 4 and 5.

Figure 6:
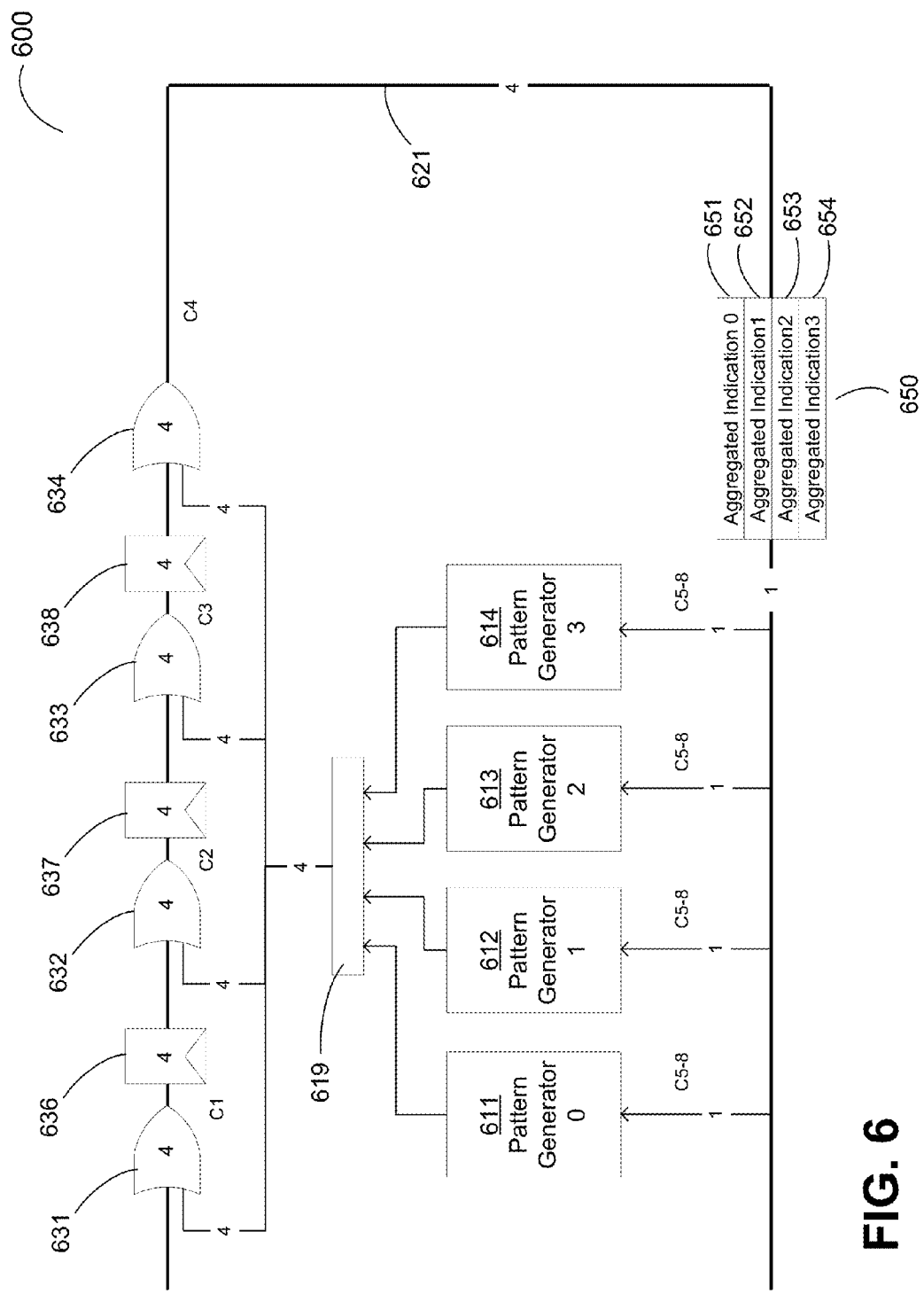
FIG. 6 depicts a schematic view of circuitry suitable for time multiplexing flags generated by a plurality of pattern generators in an automatic testing system, according to some embodiments.

FIG. 6 depicts a schematic view of circuitry suitable for time multiplexing flags generated by a plurality of pattern generators in an automatic testing system, according to some embodiments. In the example of FIG. 6, flags indicating the success or failure of a test performed by a testing system are output by pattern generators 611-614 and are aggregated by communication path 621.

During a number of cycles of system 600, flags output by each of pattern generators 611-614 are aggregated with subsequent flags output by the same pattern generator. This process produces an aggregated indication that indicates whether there were any flags indicating a failure during those cycles from that pattern generator. For example, the flags output by pattern generator 611 over four cycles of system 600 may be aggregated to produce an aggregated indication of whether pattern generator 611 generated any flags indicating a test failure during those four cycles. The aggregated indications produced in the example of FIG. 6 therefore comprise an aggregated indication for each of the pattern generators in system 600.

The aggregated indications generated may be provided to one or more circuits by time multiplexing the indications into a single signal with a number of time slots, wherein each time slot comprises the aggregated indication from one of the pattern generators. It should be appreciated that this particular approach is merely an example and any suitable technique to aggregate flags over time and to time multiplex the aggregated indications may in general be used. In the example of FIG. 4, the aggregated indications are provided to a buffer which outputs the aggregated indications one by one over a series of cycles of system 600.

In a first cycle of system 600, pattern generators 611-614 each output a flag indicating the success or failure of a test. As described above, such a flag may take any form; for example, the flag may be a single bit representing a successful test (low value) or a failed test (high value). Irrespective of how the flags are represented, in the first cycle the flags are provided to OR gates 631. In the example of FIG. 6, processing for each of the four pattern generators 611-614 occurs in a separate parallel path, each path comprising four OR gates and four flip-flops in series. For clarity these paths are represented in FIG. 6 by a single path labeled with a "4" from a component 619 in the circuit. For example, the flag output by pattern generator 611 is provided to a first one of OR gates 631 and is latched at the end of the first cycle in a first one of flip-flops 636. Similarly, the flag output by pattern generator 612 is provided to a second one of OR gates 631 and the aggregated flags output by the OR gates are latched at the end of the first cycle in a second one of flip-flops 636, etc.

In some embodiments, component 619 is a buffer configured to store flags from pattern generators 611-614 for a number of cycles before providing the flags to communication path 631.

Each of the flags provided to OR gates 631 are aggregated with the contents of the communication path 621 being input to the other inputs of the OR gates. For example, the communication path 621 might provide low values to the inputs of OR gates 631 so that the output of the OR gates are indicative of the value provided from pattern generators 611-612. However, any suitable values may be provided for aggregation with the values provided by the pattern generators.

For example, if the communication path 621 inputs a low value to OR gates 631, pattern generator 611 outputs a high value and pattern generators 612-614 output low values, a first one of flip-flops 636 will latch a high value at the end of the first cycle, and the other three of flip-flops 636 will latch low values.

During a second cycle of system 600, pattern generators 611-614 each output another flag indicating the success or failure of a test. These flags, separate from the flags output by the pattern generators during the first cycle, are provided to OR gates 632. The aggregated flags latched in flip-flops 636 during the first cycle are provided to the other inputs of the OR gates. For example, a first one of the flip-flops 636 is provided as an input to a first one of OR gates 632, and the output of pattern generator 611 is provided as another input to the first one of OR gates 632.

During third and fourth cycles of system 600, flags successively output from pattern generators 611-614 are similarly aggregated by OR gates 633 and 634. At the end of the fourth cycle of system 600, OR gates 634 output four values representing the aggregated flags of respective pattern generators 611-614, aggregated over four cycles of system 600. These aggregated indications may thereby indicate, for each of pattern generators 611-614, whether the pattern generator output at least one flag indicating a test failure during these four cycles.

The aggregated flags are provided to buffer 650, which stores the aggregated indications in one of four slots 651-654. In the example of FIG. 6, buffer 650 is depicted as a queue with four slots; however, it should be appreciated that this depiction is used merely for clarity and that any implementation of buffers consistent with the description herein may be used.

During the fifth, sixth, seventh and eighth cycles of system 600, the four aggregated flags are successively output from buffer 650. For example, during the fifth cycle, the aggregated indication produced from flags output by pattern generator 611 is output from the buffer to each of pattern generators 611-14. Also during this cycle, the aggregated indication produced from flags output by pattern generator 612 progresses from slot 652 to slot 651 in buffer 650. Similarly, aggregated indications in slots 653 and 654 progress to slots 652 and 653, respectively.

In the example of FIG. 6, the aggregated indication of flags output by each pattern generator over a period of four cycles is thereby provided to each of the four pattern generators in system 600.

It should be appreciated that the example of FIG. 6 is provided merely as an exemplary configuration of a communication path that aggregates and time multiplexes messages from pattern generators, and that other embodiments of the invention may utilize other configurations not shown in FIG. 6. For example, pattern generators 611-614 shown in FIG. 6 may instead be modules in a test system or any other logical collection of pattern generators. In such a use case, the logical pattern generators coupled to communication path 621 may perform aggregation of flags output from physical pattern generators comprised by the logical pattern generator prior to providing the flags to component 619. As such, the flag output by a logical pattern generator may comprise an aggregated indication of the success or failure of tests performed by the physical pattern generators, for example within the previous cycle of operation of the system. Aggregation within a logical pattern generator could be performed using any techniques described herein, for example the aggregation techniques described above in relation to FIG. 4.

In some embodiments, pattern generators (or logical pattern generators) are employed in a system that utilizes more than one buffer 650 to store and distribute the aggregated indicators. In such embodiments, the aggregated indication may be a signal with a plurality of time slots and a plurality of tracks; the time slots correspond to successive aggregated indications output from one of the buffers, and the tracks correspond to the number of buffers. For example, a system comprising 128 pattern generators (or logical pattern generators) utilizes 4 tracks and 32 time slots. Flags output by each pattern generator are aggregated over a 32 cycle period and output as an aggregated indication comprising 32 one-cycle time slots and four tracks. The aggregated indication will thereby include four aggregated flags, each generated from a single pattern generator over the 32 cycle period, within each time slot. However, any suitable method of providing a time multiplexed aggregated indication may be utilized, as the invention is not limited in this regard.

In some embodiments, aggregated indications generated using the techniques described above in relation to FIG. 6 are provided to a memory that stores an indication of prior tests performed by the system. For example, the memory may store "historical data" from a particular time during operation of the system, such as pin states of a DUT or details of portions of the test pattern being executed at that time. In some embodiments, data is stored in the memory for a length of time that corresponds to the length of the aggregation period. In some embodiments, the memory is implemented as a buffer, for example a FIFO.

For example, in the exemplary system described above that comprises 128 pattern generators utilizing 4 tracks and 32 time slots, the historical data may be stored in the memory for at least 64 cycles; sufficient time for test flags to be generated by the pattern generators and for aggregated indications to be propagated back to the pattern generators. This technique may, for example, allow subsequent behavior of the test system to be determined based on the aggregated indications and the data stored in the memory. For example, if the memory stores pin states of a DUT the aggregated indications may allow the test system to determine details about a particular failure, and to perform subsequent actions based on those details.

It should be appreciated that although the example of FIG. 6 depicts aggregation over a number of cycles, other embodiments of the invention may utilize a different, though fixed, number of cycles of system 600 in each aggregation step. For example, so long as the width of each time slot in the aggregated indication is fixed, and the time window of the aggregated indication is equal to the time taken to generate the aggregated indication, the number of physical cycles counted by system 600 during each step of the process does not matter.

Furthermore, it should be appreciated that the clock utilized by system 600 need not be the same clock as used by any pattern generators (or logical pattern generators) in system 600. Any suitable technique to synchronize operation of system 600 with the pattern generators may be utilized, as there is no requirement that the clocks operate at the same frequency.

Figure 7:
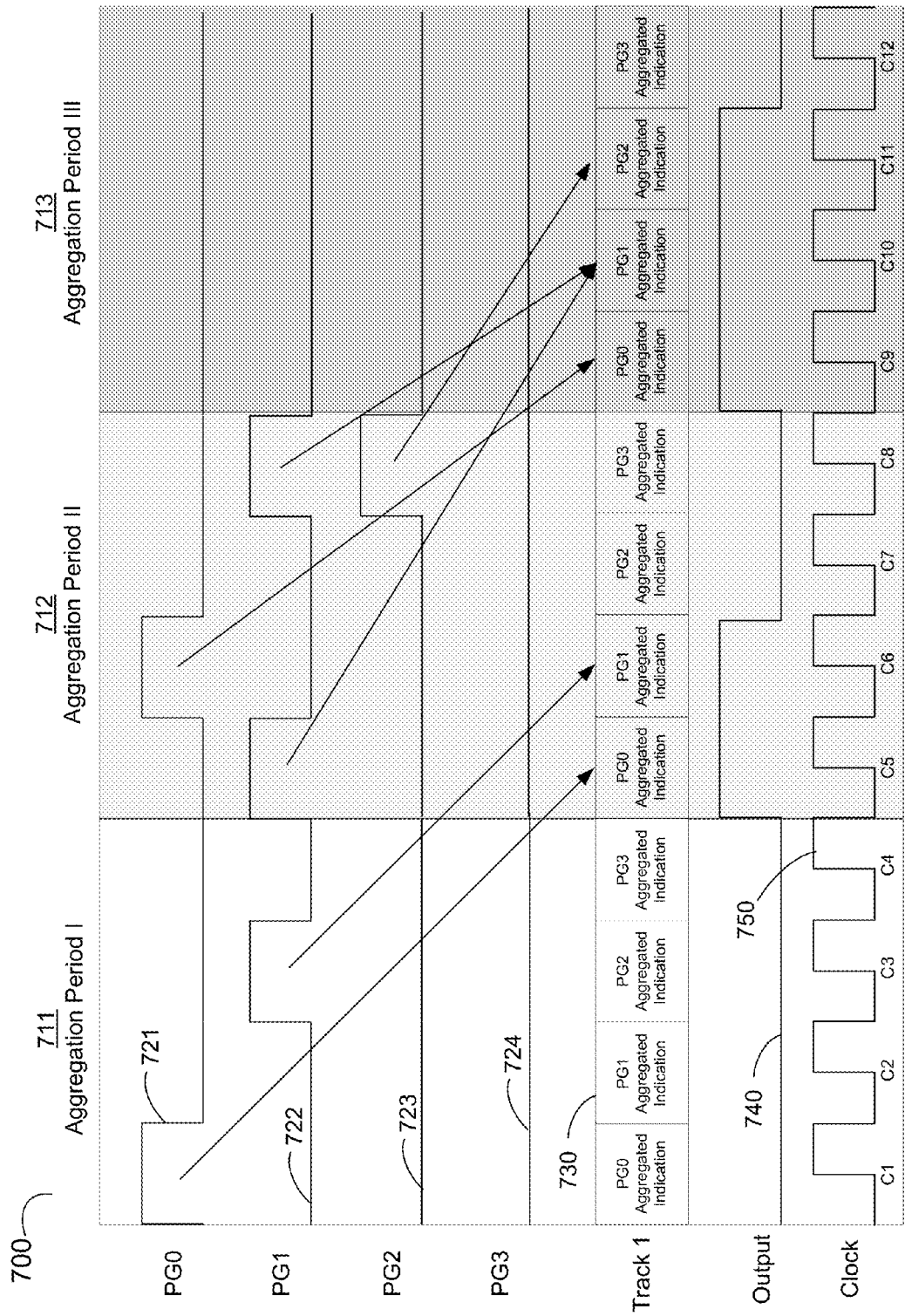
FIG. 7 illustrates an exemplary period of operation of a system that time multiplexes flags generated by a plurality of pattern generators in an automatic testing system, according to some embodiments.

FIG. 7 is a diagram depicting twelve exemplary cycles of system 600 shown in FIG. 6. In the example of FIG. 7, the flags output from pattern generators 611-614 are shown as lines 721-724, respectively. Lines 721-724 comprise a high value when a the flag output represents a failed test, and a low value when a flag output represents a successful test. For example, pattern generator 611 outputs two high values and ten low values during the twelve cycles depicted in FIG. 7.

The aggregated indications generated by system 600 are indicated by "Track 1" 730 and by the output 740. The output 740 is high when the aggregated indication corresponding to the current time slot is high, and low when the corresponding aggregated indication is low.

The clock utilized by system 600 is shown by line 750 in the example of FIG. 7. As described above, there is no requirement that the period of one cycle is equal to the period of a time slot in the aggregated indication. For example, the clock period in the example of FIG. 7 could be half or a quarter the value shown (e.g., so the time slot is twice or four times, respectively, the clock period) and be consistent with the techniques described herein.

As described above in relation to FIG. 6, during a first four cycles of system 600, aggregated indications of the four pattern generators 611-614 are generated. These four cycles are shown as aggregation period 711 and indicated by clock cycles C1-C4 at the bottom of diagram 700. During a subsequent four cycles of system 600, the aggregated indications are provided as a time multiplexed output 740, shown in FIG. 7 within aggregation period 712 and by clock cycles C5-C8 at the bottom of diagram 700. Simultaneously during these four cycles, aggregated indications of the next four flags output by pattern generators 611-614 are generated; these aggregated indications are provided as time multiplexed output during aggregation period 713.

In the example of FIG. 7, during aggregation period 711 the only flags indicating a failed test that are output by any of pattern generators 611-614 are output by pattern generator 611 during cycle 1 and by pattern generator 612 during cycle 3 (as shown by lines 721 and 722, respectively). As described above, the flags from each pattern generator are aggregated during aggregation period 711 and provided within one of four time slots of output 740 during aggregation period 712. Since the first time slot of output 740 corresponds to the flags output by pattern generator 611 during the previous aggregation period, output 740 is high during this time slot. Similarly, since the second time slot of output 740 corresponds to the flags output by pattern generator 612 during the previous aggregation period, output 740 is high during this second time slot. The third and fourth time slots of output 740 correspond to flags output by pattern generators 613 and 614, respectively; since these pattern generators output no flags indicating a failed test during the previous aggregation period, output 740 is low during these time slots.

In the example of FIG. 7, during aggregation period 712, flags indicating a failed test are output by pattern generator 611 in cycle 2, pattern generator 612 in cycles 1 and 4, and pattern generator 613 in cycle 4 (as shown by lines 721-723, respectively). The flags from each pattern generator are aggregated during aggregation period 712 and provided within one of four time slots of output 740 during aggregation period 713. Since the first three time slots of output 740 during aggregation period 713 correspond to pattern generators 611-613, and each of these pattern generators output a high value during this aggregation period, these three time slots are high. The remaining time slot during aggregation period 713 corresponds to flags output by pattern generator 614; since this pattern generator output no flags indicating a failed test during the previous aggregation period, output 740 is low during this time slot.

It should be appreciated that output 740 is shown with low values throughout aggregation period 711 merely for clarity, as any flags output by pattern generators that would give rise to high values during that aggregation period would have been output during the previous aggregation period, which is not shown in the example of FIG. 7.

Figure 8:
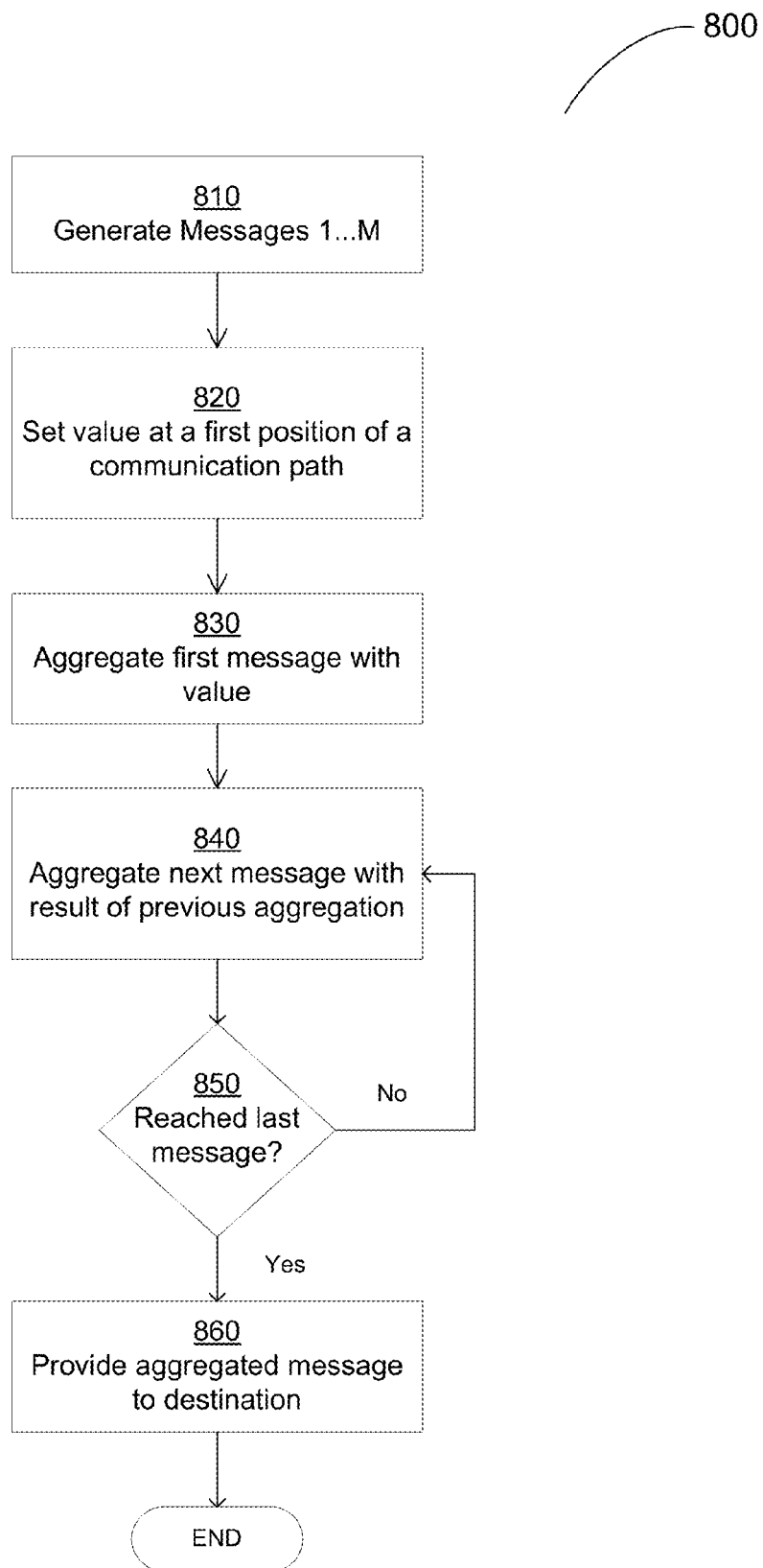
FIG. 8 shows a method of processing messages using a serial communication path, according to some embodiments.

FIG. 8 shows a method of processing messages using a serial communication path, according to some embodiments. Method 800 shown in FIG. 8 may be performed on any suitable test system capable of processing messages using a serial communication path, which include the embodiments described above.

Method 800 begins with act 810, in which M messages are generated. The messages may comprise any suitable message that may be generated within a test system. For example, the M messages generated in act 810 may comprise an indication of the result of a test performed by the test system. The messages may take any form, and for example may comprise one or more bits of information. The messages may be single bit indications of a successful or failing test generated by a pattern generator, as discussed above.

In act 820, a value is set at a first position in a communication path. The value set may comprise any suitable value such that the value is capable of being aggregated with one or more messages generated in act 810. For example, the value may be a single bit set to a low value, though may comprise any number of bits in any form.

In act 830, the first message of the M messages generated in act 810 is aggregated with the value set in act 820. Aggregation may comprise any suitable operation, or set of operations, such that the result depends upon both the message and the value. For example, aggregation of the message and the value may comprise a logical operation, such as an OR or AND operation.

In act 840 the second message of the M message generated in act 810 is aggregated with the result of the aggregation performed in act 830. This aggregation may comprise the same or a different aggregation operation as was performed in act 830. In act 850, if the final message of the M messages has not been aggregated, act 840 is performed again with the next message of the M messages and the result of the previous aggregation. This aggregation may comprise the same or a different aggregation operation as any of the aggregation operation performed in method 800 thus far.

In act 850, if the final message of the M messages has been aggregated, the result of the final aggregation is provided to a destination, for example one or more circuits. The final aggregation may, for example, provide an indication that one or more circuits in a test system failed when performing a test.

The various methods or processes outlined herein may be implemented in any suitable hardware, such as one or more processors, Field Programmable Gate Arrays (FPGAs) or Application Specific Integrated Circuits (ASICs). Data structures, including buffers, may be stored in non-transitory computer-readable storage media in any suitable form, and/or may comprise digital circuitry. For simplicity of illustration, data structures may be shown to have fields that are related through their location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art.

For example, techniques for the design and operation of a serial communication path in a test system were described. These techniques may be applied in other contexts. For example, low latency communication using a serial communication path in any digital circuitry, including in a computer system, may use techniques as described herein.

Further, single bit failure flags were described as an example of indications of events. There is no requirement that the events be failures. Techniques as described herein may be used to aggregate and distribute information about any suitable types of events, including, for example, execution of a programmed instruction that alters operation of the test system. Moreover, there is no requirement that the events be single bits. Events may be communicated in multiple-bit format such that multiple events or multi-valued events may be communicated.

Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A system for processing flags that indicate a state of a device under test, the flags being processed in a plurality of successive cycles, the system comprising:
a plurality of pattern generators, each pattern generator configured to receive a signal from a device under test and to output a flag indicating a state of the device under test based on the received signal, the plurality of pattern generators configured to operate synchronously;
a first plurality of buffers, each buffer associated with a respective pattern generator and configured to store a flag output by the respective pattern generator;
a communication path configured to receive the plurality of flags from the buffers and to perform aggregation of the flags, thereby generating an aggregated indication; and
one or more circuits, the one or more circuits configured to operate synchronously and to receive the aggregated indication,
wherein buffers of the first plurality of buffers are configured to store flags from respective pattern generators for different times.

2. The system of claim 1, additionally comprising a second plurality of buffers, each buffer associated with a respective circuit of the one or more circuits and configured to store the aggregated indication from the communication path,
wherein buffers of the second plurality of buffers are configured to store the aggregated indication from the communication path for different times.

3. The system of claim 2, wherein buffers of the first plurality of buffers and the second plurality of buffers are First In First Out (FIFO) buffers.

4. The system of claim 2, wherein the one or more circuits are the plurality of pattern generators.

5. The system of claim 4, wherein:
the plurality of pattern generators each comprises an output providing a flag to a respective buffer of the first plurality of buffers,
the one or more circuits each comprises an input receiving the aggregated indication from a respective buffer of the second plurality of buffers, and
the communication path is configured as a loop comprising a forward path and a backward path, the forward path sequentially connecting buffers of the first plurality of buffers and the backward path sequentially connecting buffers of the second plurality of buffers.

6. The system of claim 2, wherein the second plurality of buffers are configured to simultaneously provide the aggregated indication to the one or more circuits.

7. The system of claim 2, wherein:
the first plurality of buffers are coupled to the communication path in an order, and the first plurality of buffers are configured to provide respective flags indicating events at a first time during successive periods based on the order of the first plurality of buffers, wherein a period is a fixed number of cycles.

8. The system of claim 7, wherein:
the plurality of pattern generators are configured to simultaneously output flags indicating events at the first time to each of the first plurality of buffers, and
the second plurality of buffers are each configured to simultaneously provide an aggregated indication of events at the first time to the respective circuit.

9. The system of claim 8, wherein:
the communication path comprises a plurality of tracks,
the first plurality of buffers are configured to, during each cycle, provide a flag to successive tracks, and
the communication path is configured to perform aggregation of the flags by aggregating flags within the plurality of tracks.

10. The system of claim 1, wherein the system is an automatic testing system and at least a portion of the flags represent the failure of a test of the device under test in the automatic testing system.

11. The system of claim 10, wherein the one or more circuits comprise test pattern generators.

12. The system of claim 10, wherein:
the system comprises a backplane and a plurality of instrument modules coupled through the backplane, and
the plurality of pattern generators and/or the one or more circuits comprise instrument modules of the plurality of instrument modules.

13. The system of claim 1, wherein the flags are event indications.

14. The system of claim 1, wherein:
the first plurality of buffers are coupled to the communication path in an order,
the aggregated indication comprises a signal with a plurality of time slots, and
the communication path is configured to perform aggregation of the flags by setting values within time slots of the plurality of time slots based on flags from respective pattern generators of the plurality of pattern generators.

15. The system of claim 14, wherein:
the communication path comprises at least one track, a first track of the at least one tracks configured to receive a flag during each cycle from one of a subset of the first plurality of buffers, and
the communication path is configured to perform aggregation of the flags by aggregating on the first track the flags received from buffers of the subset.

16. The system of claim 15, wherein the subset of the first plurality of buffers comprises N buffers and the communication path is configured to propagate an aggregated indication from a first end of the communication path to a second end of the communication path in N cycles.

17. The system of claim 16, wherein the one or more circuits comprises a memory configured to store historical data, and wherein the system is configured to keep or discard data in the memory based on the aggregated indicator.

18. The system of claim 17, wherein the dwell time of the memory is N cycles.

19. An interface circuit for an automatic test system in which a communication path carries flags that indicate a state of a device under test, comprising:
a plurality of input ports;
a plurality of output ports;
a reference clock input;
a first plurality of buffers coupled to the reference clock input, each buffer of the first plurality of buffers coupled to an input port and configured to receive flags that indicate a state of a device under test, the flags being received at a time controlled by the reference clock;
a communication path configured to receive the plurality of flags from the first plurality of buffers and to perform aggregation of the flags, thereby generating an aggregated indication of states of the device under test; and
a second plurality of buffers, each buffer of the second plurality of buffers coupled to an output port, configured to store the aggregated indication and to synchronously output the aggregated indication to a respective output port.

20. The interface circuit of claim 19, wherein buffers of the first plurality of buffers and the second plurality of buffers are First In First Out (FIFO) buffers.

21. The interface circuit of claim 19, wherein:
the communication path is configured as a loop comprising a forward path and a backward path, the forward path sequentially connecting buffers of the first plurality of buffers and the backward path sequentially connecting buffers of the second plurality of buffers.

22. The interface circuit of claim 19, wherein the interface circuit is a backplane interface circuit configured to be used in an automatic testing system and at least a portion of the flags represent the failure of a test in the automatic testing system.

23. The interface circuit of claim 19, wherein the flags are event indications.

24. The interface circuit of claim 19, wherein the second plurality of buffers are configured to simultaneously provide the aggregated indication to the output ports.

25. The interface circuit of claim 19, wherein:
the first plurality of buffers are coupled to the communication path in an order,
the aggregated indication comprises a signal with a plurality of time slots, and
the communication path is configured to perform aggregation of the flags by setting values within time slots of the plurality of time slots based on flags from respective input ports of the plurality of input ports.

26. The interface circuit of claim 25, wherein:
the communication path comprises at least one track, a first track of the at least one tracks configured to receive a flag during each cycle from one of a subset of the first plurality of buffers, and
the communication path is configured to perform aggregation of the flags by aggregating on the first track the flags received from buffers of the subset.

27. The interface circuit of claim 26, wherein the subset of the first plurality of buffers comprises N buffers and the communication path is configured to propagate an aggregated indication from a first end of the communication path to a second end of the communication path in N cycles.

28. The interface circuit of claim 19, wherein:
the first plurality of buffers are coupled to the communication path in an order, and
the first plurality of buffers are configured to provide respective flags indicating events at a first time during successive cycles based on the order of the first plurality of buffers.

29. The interface circuit of claim 28, wherein:
the second plurality of buffers are each configured to simultaneously provide an aggregated indication of events at the first time to the respective output port.

30. The interface circuit of claim 29, wherein:
the communication path comprises a plurality of tracks,
the first plurality of buffers are configured to, during each cycle, provide a flag to successive tracks, and
the communication path is configured to perform aggregation of the flags by aggregating flags within the plurality of tracks.

* * * * *